United States Patent
Chinthu et al.

(10) Patent No.: US 12,348,133 B2
(45) Date of Patent: Jul. 1, 2025

(54) MULTI-STAGE CHARGE PUMP CIRCUIT INCLUDING VOLTAGE LEVEL SHIFTER FOR CLOCK SIGNAL GENERATION

(71) Applicant: GlobalFoundries U.S. Inc., Malta, NY (US)

(72) Inventors: Siva Kumar Chinthu, Bangalore (IN); Palle Sundar Veerendranath, Andhrapradesh (IN); Venu Gopal Reddy Ara, Bangalore (IN); Abdul Rajak, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/350,316

(22) Filed: Jul. 11, 2023

(65) Prior Publication Data
US 2025/0023466 A1    Jan. 16, 2025

(51) Int. Cl.
*H02M 3/07* (2006.01)
*H03K 19/0185* (2006.01)

(52) U.S. Cl.
CPC .... *H02M 3/073* (2013.01); *H03K 19/018521* (2013.01)

(58) Field of Classification Search
None
See application file for complete search history.

(56) References Cited

U.S. PATENT DOCUMENTS

| 4,149,232 A | 4/1979 | Eaton, Jr. |
| 5,059,815 A | 10/1991 | Bill et al. |
| 5,436,587 A * | 7/1995 | Cernea .................. H02M 3/073 |
| | | 327/390 |
| 5,734,286 A | 3/1998 | Takeyama et al. |

(Continued)

FOREIGN PATENT DOCUMENTS

EP    4072015 A1    12/2022

OTHER PUBLICATIONS

Ballo et al., "A Review of Charge Pump Topologies for the Power Management of IoT Nodes," MDPI Electronics, 8, 480, 2019, pp. 1-15.

(Continued)

*Primary Examiner* — Thomas J. Hiltunen
(74) *Attorney, Agent, or Firm* — David Cain; Hoffman Warnick LLC

(57) ABSTRACT

A disclosed charge pump includes first and second stages and, optionally, additional stage(s). The first stage receives a voltage input (Vin) at a first voltage (V1), CLK1 (GND, V1), and CLK1B (V1, GND), and outputs a first stage voltage output (Vout1) at a second voltage (V2) double V1. A second stage receives Vout1, CLK2 (V1, V2), and CLK2B (V2, V1, and outputs a second stage voltage output (Vout2) at a third voltage (V3) essentially triple V1, and so on. A clock driver supplies CLK1-CLK1B to the first stage and to a clock generator. The clock generator includes: a voltage level shifter, which receives CLK1 and CLK1B and outputs multiple level-shifted voltage output pulses; and a driving (Continued)

circuit, which receives specific ones of the output voltage pulses and outputs CLK2 and CLK2B to the second stage and, if needed, additional voltage level-shifted clock signal-inverted clock signal pairs to any additional stages.

18 Claims, 10 Drawing Sheets

(56) References Cited

U.S. PATENT DOCUMENTS

| | | | |
|---|---|---|---|
| 6,028,473 A | 2/2000 | Kamei et al. | |
| 6,046,626 A | 4/2000 | Saeki et al. | |
| 6,046,627 A | 4/2000 | Itoh et al. | |
| 6,099,100 A | 8/2000 | Lee | |
| 6,160,723 A * | 12/2000 | Liu | H02M 3/073 363/60 |
| 6,191,963 B1 | 2/2001 | McPartland et al. | |
| 6,356,469 B1 | 3/2002 | Roohparvar et al. | |
| 6,392,905 B1 | 5/2002 | Huang et al. | |
| 6,483,728 B1 * | 11/2002 | Johnson | H02M 3/073 363/60 |
| 6,525,949 B1 | 2/2003 | Johnson et al. | |
| 6,570,434 B1 | 5/2003 | Hsu et al. | |
| 6,747,897 B2 * | 6/2004 | Karaki | G11C 5/145 365/185.27 |
| 6,819,162 B2 | 11/2004 | Pelliconi | |
| 6,922,096 B2 * | 7/2005 | Cernea | G11C 5/145 327/536 |
| 6,995,603 B2 | 2/2006 | Chen et al. | |
| 7,116,156 B2 | 10/2006 | Myono et al. | |
| 7,710,183 B2 | 5/2010 | Chaba et al. | |
| 8,049,553 B2 * | 11/2011 | Kim | G11C 5/145 363/60 |
| 8,476,963 B2 * | 7/2013 | Cook | H02M 3/07 363/60 |
| 8,963,624 B2 * | 2/2015 | Murakami | H02M 3/073 327/536 |
| 9,013,229 B2 | 4/2015 | Rahman et al. | |
| 9,160,930 B2 | 10/2015 | Ishii | |
| 9,306,450 B2 | 4/2016 | Emira et al. | |
| 9,548,655 B2 | 1/2017 | Ersoy et al. | |
| 10,355,694 B1 | 7/2019 | Kumar | |
| 10,498,230 B1 | 12/2019 | Chen et al. | |
| 10,911,047 B1 | 2/2021 | Shetty et al. | |
| 11,139,004 B2 * | 10/2021 | Sinha | H02M 3/07 |
| 11,277,121 B1 | 3/2022 | Goyal et al. | |
| 11,569,738 B1 * | 1/2023 | Chinthu | H02M 3/07 |
| 11,671,080 B1 | 6/2023 | Ross et al. | |
| 11,843,374 B2 | 12/2023 | Lee | |
| 2008/0012627 A1 * | 1/2008 | Kato | G11C 16/12 327/536 |
| 2009/0134929 A1 | 5/2009 | Luo | |
| 2010/0309716 A1 * | 12/2010 | Tsukada | G11C 13/0004 365/163 |
| 2010/0327959 A1 | 12/2010 | Lee | |
| 2014/0132329 A1 | 5/2014 | Li et al. | |
| 2019/0379365 A1 | 12/2019 | Hsu et al. | |
| 2025/0023564 A1 | 1/2025 | Chinthu et al. | |
| 2025/0023566 A1 | 1/2025 | Chinthu et al. | |

OTHER PUBLICATIONS

Cavalheiro et al., "Insights into Tunnel FET-Based Charge-Pumps and Rectifiers for Energy Harvesting Applications," IEEE Transactions on Very Large Scale Integration (VLSI) Systems, vol. 25, Issue 3, 2017, pp. 1-11.

Chen et al., "A Sub-100mV Ultra-Low Voltage Level-Shifter Using Current Limiting Cross-Coupled Technique for Wide-Range Conversion to 1/0 Voltage," IEEE Access, vol. 8, published Aug. 6, 2020, pp. 145577-145585.

Lanuzza et al., "Low-Power Level Shifter for Multi-Supply Voltage Designs," IEEE Transactions on Circuits and Systems—II: Express Briefs, vol. 59, No. 12, Dec. 2012, pp. 922-926.

Pan et al., "A Low Voltage to High Voltage Level Shifter Circuit for MEMS Application," IEEE, In Proceedings of the 15th Biennial University/Government/Industry Microelectronics Symposium, Jul. 2003, pp. 128-131.

Pelliconi et al., "Power Efficient Charge Pump in Deep Submicron Standard CMOS Technology," IEEE Journal of Solid-State Circuits, vol. 38, No. 6, Jun. 2003, pp. 1068-1071.

U.S. Appl. No. 17/488,380, Office Action dated Apr. 28, 2022, 11 pages.

U.S. Appl. No. 17/488,380, Response to Office Action submitted May 27, 2022, 19 pages.

U.S. Appl. No. 17/488,380, Final Office Action dated Aug. 31, 2022, 13 pages.

U.S. Appl. No. 17/488,380, Response to Final Office Action submitted Sep. 26, 2022, 21 pages.

U.S. Appl. No. 17/488,380, 2nd After Final Response dated Oct. 5, 2022, 10 pages.

U.S. Appl. No. 17/488,380, Advisory Action dated Oct. 5, 2022, 17 pages.

U.S. Appl. No. 17/488,380, Notice of Allowance dated Oct. 21, 2022, 9 pages.

Extended European Search Report for related EP Application No. 24151286.2-1201 dated Jun. 14, 2024, 11 pages.

U.S. Appl. No. 18/350,294, filed Jul. 11, 2023, 38 pages.

U.S. Appl. No. 18/350,305, filed Jul. 11, 2023, 48 pages.

U.S. Appl. No. 18/350,327, filed Jul. 11, 2023, 59 pages.

U.S. Appl. No. 18/350,327, Notice of Allowance dated Jan. 27, 2025, 8 pages.

U.S. Appl. No. 18/350,305, Office Action dated Apr. 17, 2025, 10 pages.

U.S. Appl. No. 18/350,305, Amendment to Office Action filed Apr. 24, 2025, 13 pages.

U.S. Appl. No. 18/350,294, Office Action dated May 6, 2025, 13 pages.

* cited by examiner

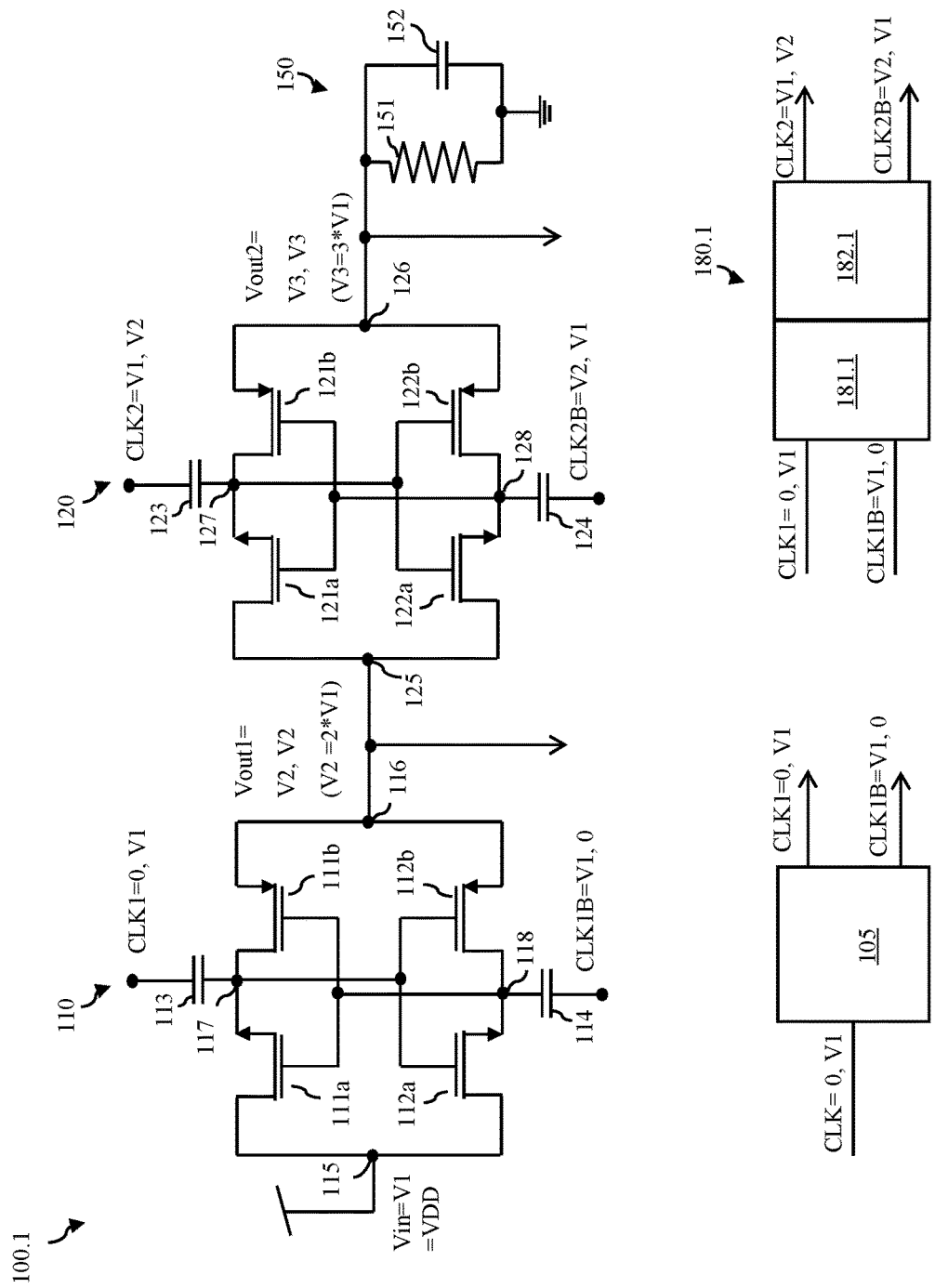
FIG. 1.1

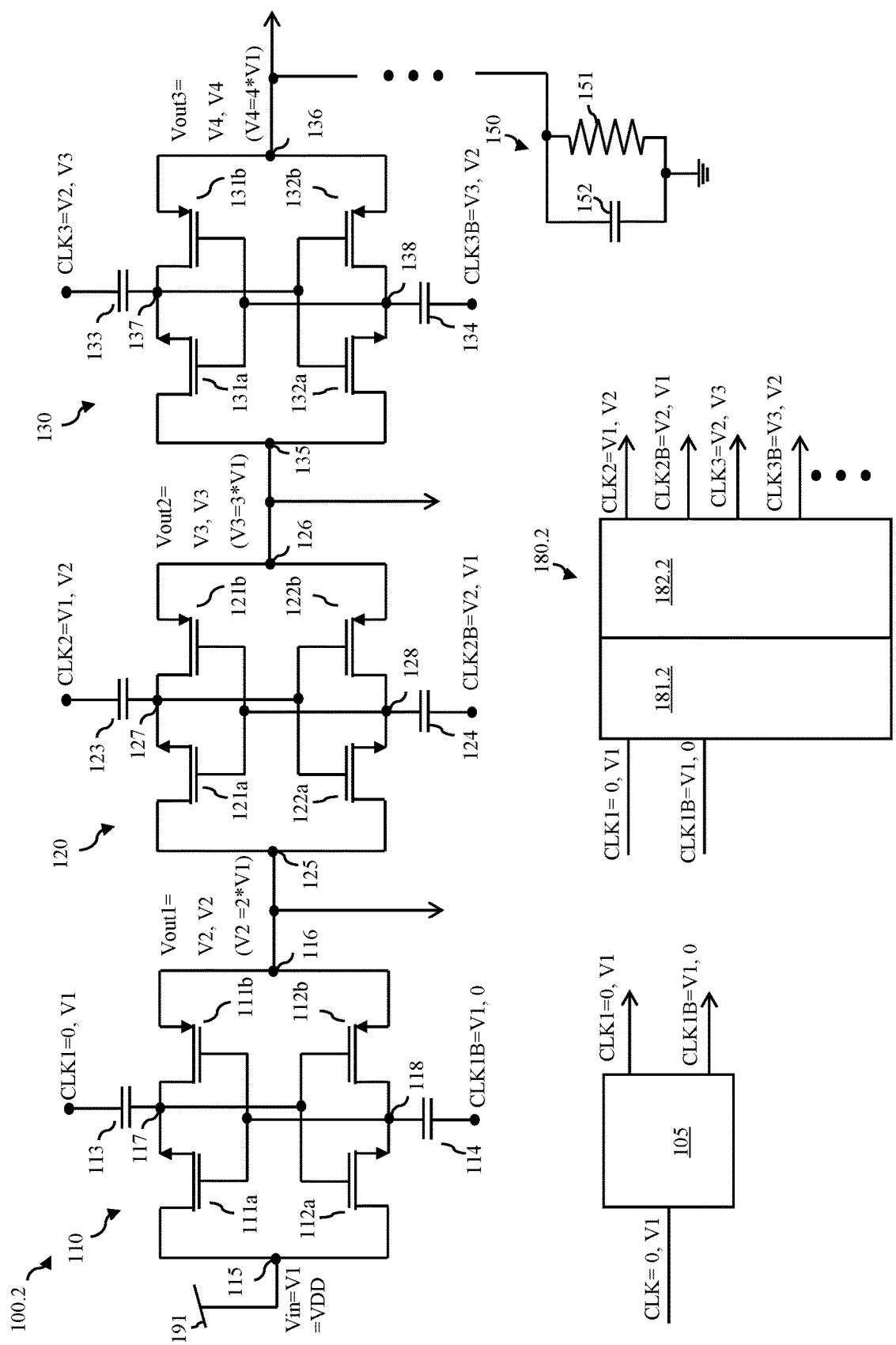
FIG. 1.2

(E.g., 1.8V transistors, GND=0.0V, V1=1.8V, and V2=3.6V)

(E.g., 1.8V transistors, GND=0.0V, V1=1.8V, V2=3.6V, and V3=5.4V)

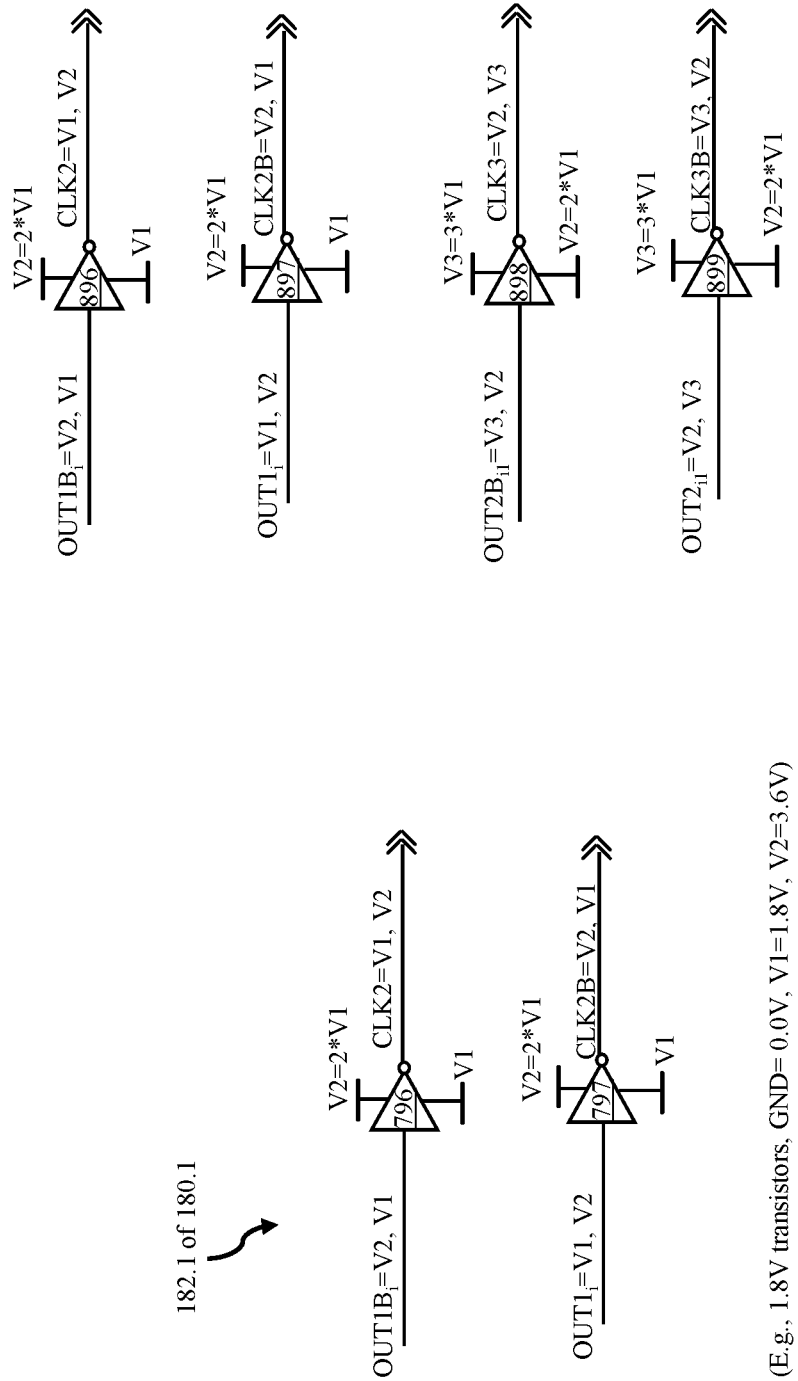

MULTI-STAGE CHARGE PUMP CIRCUIT INCLUDING VOLTAGE LEVEL SHIFTER FOR CLOCK SIGNAL GENERATION

BACKGROUND

The present disclosure relates to charge pumps and, more particularly, to embodiments of a multi-stage charge pump with reduced area and improved reliability.

Considerations in modern integrated circuit (IC) design include, but are not limited to, performance improvement, size scaling, and power consumption. Oftentimes design changes to improve one aspect of the design can yield an undesirable trade-off with other aspects of the design. For example, in ICs, a charge pump is a circuit configured to convert an input direct current (DC) power supply (referred to herein as a voltage input (Vin)) to at least one different DC power supply (referred to herein as a voltage output (Vout)). A single-stage charge pump can convert a Vin at a first voltage (e.g., positive supply voltage (VDD)) to a Vout that is, for example, double the magnitude of the voltage input (i.e., Vout=2*Vin or 2*VDD). A multi-stage charge pump can include: a first stage that coverts Vin to a first stage voltage output (Vout1) of 2*Vin or 2*VDD); a second stage that further converts the Vout1 of 2*Vin to a second stage voltage output (Vout2) that is triple the magnitude of Vin (i.e., Vout2=3*Vin or 3*VDD); and, optionally, one or more additional downstream stages (e.g., to output voltage outputs of 4*Vin, 5*Vin, and so on). With such multi-stage charge pumps, each downstream stage requires a greater amount of added capacitance (e.g., through additional series-connected capacitors or a higher voltage capacitor) than the previous stage in order to achieve the desired voltage boost. Additionally, multi-stage charge pumps that employ series-connected capacitors in the downstream charge pumping stages, may require biasing of internal capacitor nodes. As a result, such multi-stage charge pumps are relatively complex and consume a significant amount of chip area.

SUMMARY

Disclosed herein are embodiments of a structure. The structure can include multiple charge pump stages including a first stage and a second stage. The first stage can receive a voltage input at a first voltage, a first clock signal, and an inverted first clock and can output a first stage voltage output at a second voltage that is higher than the first voltage. The structure can also include a clock generator. The clock generator can receive the first clock signal and the inverted first clock signal and can output a second clock signal and an inverted second clock signal that are voltage level-shifted (higher) relative to the first clock signal and the inverted second clock signal. The second stage can receive the first stage voltage output from the first stage and the second clock signal and the inverted second clock signal from the clock generator and can output a second stage voltage output at a third voltage that is higher than the second voltage.

Some embodiments of a structure disclosed herein can include multiple charge pump stages including a first stage and a second stage. The first stage can receive a voltage input at a first voltage, a first clock signal, and an inverted first clock and can output a first stage voltage output at a second voltage essentially double the first voltage; and a second stage. The structure can also include a clock generator. The clock generator can receive the first clock signal and the inverted first clock signal and can output a second clock signal and an inverted second clock signal that are voltage level-shifted (higher) relative to the first clock signal and the inverted second clock signal. The second stage can receive the first stage voltage output from the first stage and the second clock signal and the inverted second clock signal from the clock generator and can output a second stage voltage output at a third voltage essentially triple the first voltage.

Some embodiments of a structure disclosed herein can include multiple charge pump stages including a first stage, a second stage and a third stage. The first stage can receive a voltage input at a first voltage, a first clock signal, and an inverted first clock and can output a first stage voltage output at a second voltage essentially double the first voltage. The structure can further include a clock generator. The clock generator can receive the first clock signal and the inverted first clock signal and can output a second clock signal and an inverted second clock signal that are voltage level-shifted (higher) relative to the first clock signal and the inverted first clock signal and can further output a third clock signal and an inverted third clock signal that are voltage level-shifted (higher) relative to the second clock signal and the inverted second clock signal. The second stage can receive the first stage voltage output from the first stage and the second clock signal and the inverted second clock signal from the clock generator and can output a second stage voltage output at a third voltage essentially triple the first voltage. The third stage can receive the second stage voltage output from the second stage and the third clock signal and the inverted third clock signal from the clock generator and can output a third stage voltage output at a fourth voltage essentially four times the first voltage.

BRIEF DESCRIPTION OF THE DRAWINGS

The present disclosure will be better understood from the following detailed description with reference to the drawings, which are not necessarily drawn to scale and in which:

FIG. 1.1 is a schematic diagram illustrating disclosed embodiments of a structure and, particularly, a charge pump;

FIG. 1.2 is a schematic diagram illustrating other disclosed embodiments of a structure;

FIG. 7 is a schematic diagram illustrating an example of a driving circuit that can be incorporated into the structure of FIG. 1.1; and FIG. 8 is a schematic diagram illustrating an example of a driving circuit that can be incorporated into to the structure of FIG. 1.2.

DETAILED DESCRIPTION

Figure 2:
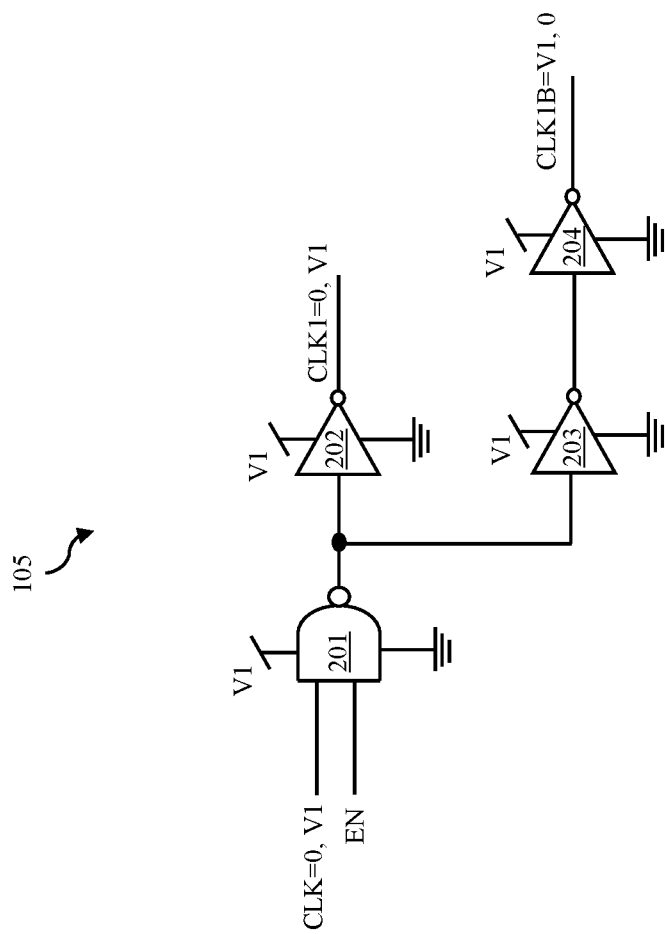
FIG. 2 is a schematic diagram illustrating a preliminary clock driver that can be incorporated into the structure of FIG. 1.1 or FIG. 1.2.

As mentioned above, considerations in modern integrated circuit (IC) design include, but are not limited to, performance improvement, size scaling, and power consumption. Oftentimes design changes to improve one aspect of the design can yield an undesirable trade-off with other aspects of the design. For example, in ICs, a charge pump is a circuit configured to convert an input direct current (DC) power supply (referred to herein as a voltage input (Vin)) to at least one different DC power supply (referred to herein as a voltage output (Vout)). A single-stage charge pump can convert a Vin at a first voltage (e.g., positive supply voltage (VDD)) to a Vout that is, for example, double the magnitude of the voltage input (i.e., Vout=2*Vin or 2*VDD). A multi-stage charge pump can include: a first stage that coverts Vin to a first stage voltage output (Vout1) of 2*Vin or 2*VDD; a second stage that further converts the Vout1 of 2*Vin to a second stage voltage output (Vout2) that is triple the magnitude of Vin (i.e., Vout2=3*Vin or 3*VDD); and, optionally, one or more additional downstream stages (e.g., to output voltage outputs of 4*Vin, 5*Vin, and so on). With such multi-stage charge pumps, each downstream stage requires a greater amount of added capacitance (e.g., through additional series-connected capacitors or a higher voltage capacitor) than the previous stage in order to achieve the desired voltage boost. Additionally, multi-stage charge pumps that employ series-connected capacitors in the downstream charge pumping stages, may require biasing of internal capacitor nodes. As a result, such multi-stage charge pumps are relatively complex and consume a significant amount of chip area.

In view of the foregoing, disclosed herein are embodiments of a structure and, particularly, a reliability improved and area efficient multi-stage charge pump. The charge pump can include multiple stages including at least a first stage and a second stage and, optionally, one or more additional stages. The first stage can receive a voltage input (Vin) at a first voltage (V1) (e.g., V1 can be equal to a positive supply voltage (VDD)). The first stage can be controlled by a first clock signal (CLK1) that transitions between ground (GND) at 0.0 volts and V1 and an inverted first clock signal (CLK1B) and can output a first stage voltage output (Vout1) at a second voltage (V2) essentially double the magnitude of V1. The second stage can receive Vout1, can be controlled by a second clock signal (CLK2) that transitions between V1 and V2 (so as to be voltage level-shifted relative to CLK1 but with the same amplitude) and an inverted second clock signal (CLK2B), and can output a second stage voltage output (Vout2) at a third voltage (V3) essentially triple the magnitude of V1. Optionally, a third stage can receive Vout2, can be controlled by a third clock signal (CLK3) that transitions between V2 and V3 (so as to be voltage level-shifted as compared to CLK2 but with the same amplitude) and an inverted third clock signal (CLK3B), and can output a third stage voltage output (Vout3) at a fourth voltage (V4) essentially four times V1, and so on. The charge pump can further include additional circuitry for supplying the stage-specific clock signal-inverted clock signal pairs to the different stages. This additional circuitry can include a preliminary clock driver that supplies CLK1 and CLK1B to the first stage and a clock generator that generates and supplies voltage level-shifted clock signal-inverted clock signal pairs (e.g., CLK2-CLK2B and, if applicable, CLK3-CLK3B, etc.) to the downstream stages. The clock generator can specifically include a voltage level shifter, which receives CLK1 and CLK1B from the preliminary clock driver as input voltage pulses and which outputs multiple output voltage pulses (which are voltage level shifted) in response. The clock generator can further include a driving circuit that receives specific output voltage pulses from the voltage level shifter (as discussed in greater detail below) and at least buffers (e.g., strengthens) those output voltage pulses to output CLK2 and CLK2B to the second stage and, if applicable, to output CLK3 and CLK3B to a third stage, and so on. By employing such voltage level-shifted clock signal-inverted clock signal pairs to control downstream stages within the multi-stage charge pump instead of employing the same clock signal-inverted clock signal pair for all stages, the disclosed embodiments eliminate the need for additional series-connected capacitors or higher voltage capacitors in the downstream stages and thereby reduce circuit complexity and chip area consumption while also improving reliability. Additionally, in some embodiments, the voltage level shifter of the clock generator can include all low voltage transistors (e.g., 3.3V transistors or lower, such as 1.8V, 1.5V, or 0.8V transistors) for reduced power consumption, can include all symmetric transistors (absent any process variations) for reduced circuit complexity, and can still be configured in such a way as to operate within the safe operating area (SOA) of the transistors.

FIGS. 1.1 and 1.2 are schematic diagrams illustrating disclosed embodiments of a charge pump 100.1 and 100.2, respectively. The charge pump 100.1, 100.2 can be a multi-stage charge pump. Specifically, the charge pump 100.1 of FIG. 1.1 can be a two-stage charge pump including, among other components (as discussed in greater detail below), a first stage 110 and a second stage 120. The charge pump 100.2 of FIG. 1.2 can be a three or more-stage charge pump including, among other components (as discussed in greater detail below), a first stage 110, a second stage 120, a third stage 130 and, optionally, one or more additional stages (not shown).

In the charge pump 100.1, 100.2 each stage 110, 120, 130 (if applicable, e.g., as in the charge pump 100.2 of FIG. 1.2) can include an input node 115, 125, 135 and an output node 116, 126, 136. In the first stage 110, input node 115 can be connected (e.g., to a first voltage rail) to receive a voltage input (Vin) at a first voltage (V1). V1 can, for example, be a positive supply voltage (VDD) for the circuit. Optionally, VDD can be a relatively low positive supply voltage. For example, in some embodiments VDD can be set at 3.3 volts (V) or less (e.g., at 1.8V, at 1.5V, at 0.8V, etc.). In some embodiments, devices within the charge pump can have a same maximum voltage rating (e.g., as specified in the device data sheets) and VDD can be set at the maximum voltage rating. In each downstream stage, the input node can be electrically connected to the output node of the immediately preceding stage. That is, in the second stage 120, input node 125 can be electrically connected to output node 116 of the first stage 110. In a third stage 130 (if applicable), input node 135 can be electrically connected to output node 126 of second stage 120, and so on.

In the charge pump 100.1, 100.2 each stage 110, 120, 130 (if applicable, e.g., as in the charge pump 100.2 of FIG. 1.2) can further include a pair of cross coupled inverters connected between the input node 115, 125, 135 and the output node 116, 126, 136. A first inverter can include an n-type field effect transistor (NFET) 111a, 121a, 131a and a p-type field effect transistor (PFET) 111b, 121b, 131b connected in series between the input node 115, 125, 135 and the output node 116, 126, 136. A second inverter can include an NFET 112a, 122a, 132a and a PFET 112b, 122b, 132b connected in series between the input node 115, 125, 135 and the output node 116, 126, 136 such that the first and second inverters are connected in parallel. Additionally, the first and second inverters can further be cross coupled. That is, the gates of the series-connected FETs 111a-111b, 121a-121b, 131a-131b of the first inverter can be electrically connected to a junction 118, 128, 138 between the series-connected FETs 112a-112b, 122a-122b, 132a-132b of the second inverter. Furthermore, the gates of the series-connected FETs 112a-112b, 122a-122b, 132a-132b of the second inverter can be electrically connected to a junction 117, 127, 137 between the series-connected FETs 111a-111b, 121a-121b, 131a-131b of the first inverter.

In the charge pump 100.1, 100.2 each stage 110, 120, 130 (if applicable, e.g., as in the charge pump 100.2 of FIG. 1.2) can further include first and second capacitors. A first capacitor 113, 123, 133 can include two capacitor plates separated by a dielectric layer. One capacitor plate can be electrically connected to the junction 117, 127, 137 between the FETs of the first inverter and the capacitor plate can be electrically connected to receive a stage-specific clock signal (as discussed in greater detail below). The second capacitor 114, 124, 134 can similarly include two capacitor plates separated by a dielectric layer. One capacitor plate can be electrically connected to the junction 118, 128, 138 between the FETs of the second inverter and the other capacitor plate can be electrically connected to receive an inverted stage-specific clock signal (as discussed in greater detail below).

In the first stage 110, the input node 115 can be connected to receive a voltage input (Vin) that is steady at V1 (as discussed above). The first capacitor 113 can be connected to receive a first clock signal (CLK1) that transitions between (i.e., oscillates between) GND and V1. The second capacitor 114 can be connected so as to receive an inverted first clock signal (CLK1B), which is inverted with respect to CLK1 (i.e., when CLK1 transitions from GND to V1, CLK1B transitions from V1 to GND, and vice versa). As a result, the voltage signal at junction 117 between the FETs of the first inverter transitions between V1 and a second voltage (V2), which is essentially double the magnitude of V1 (e.g., +/−10%). For example, if V1=1.8V, then V2=3.6V+/−0.36V. If V1=1.5V, then V2=3.0V+/−0.30V. If V1=0.8V, then V2=1.6V+/−. 16V. Furthermore, the voltage signal at junction 118 between the FETs of the second inverter will be inverted with respect to the voltage signal at junction 117. In operation, when CLK1 switches to GND and CLK1B switches to V1, the voltage signal at junction 117 between the FETs of the first inverter drops to V1 turning off the NFET 112a and turning on the PFET 112b of the second inverter and the voltage signal at junction 118 between the FETs of the second inverter is raised to V2 turning on the NFET 111a and turning off the PFET 111b of the first inverter. When CLK1 switches to V1 and CLK1B switches to GND, the voltage signal at junction 117 rises to V2 turning on the NFET 112a and turning off the PFET 112b of the second inverter and the voltage signal at junction 118 drops to V1 turning off the NFET 111a and turning on the PFET 111b of the first inverter. As a result, Vout1 at output node 116 is continuously pulled to V2, regardless of the states of CLK1 and CLK1B. In other words, Vout1 from the first stage 110 remains steady at V2.

In the second stage 120, the input node 125 can be connected to receive Vout1 that is steady at V2 (as discussed above). The first capacitor 123 can be connected to receive a second clock signal (CLK2) that transitions between (i.e., oscillates between) V1 and V2. In other words, CLK2 is voltage-level shifted as compared to CLK1 but with the same amplitude. The second capacitor 124 can be connected to receive an inverted second clock signal (CLK2B), which is inverted with respect to CLK2 (i.e., when CLK2 transitions from V1 to V2, CLK2B transitions from V2 to V1, and vice versa). As a result, the voltage signal at junction 127 between the FETs of the first inverter transitions between V2 and a third voltage (V3), which is essentially triple the magnitude of V1 (e.g., +/−10%). For example, if V1=1.8V, then V3=5.4V+/−0.54V. If V1=1.5V, then V3=4.5V+/−0.45V. If V1=0.8V, then V3=2.4V+/−0.24V. Furthermore, the voltage signal at junction 128 between the FETs of the second inverter will be inverted with respect to the voltage signal at junction 127. In operation, when CLK2 switches to V1 and CLK2B switches to V2, the voltage signal at junction 127 between the FETs of the first inverter drops to V2 turning off the NFET 122a and turning on the PFET 122b of the second inverter and the voltage signal at junction 128 between the FETs of the second inverter is raised to V3 turning on the NFET 121a and turning off the PFET 121b of the first inverter. When CLK2 switches to V2 and CLK2B switches to V1, the voltage signal at junction 127 rises to V3 turning on the NFET 122a and turning off the PFET 122b of the second inverter and the voltage signal at junction 128 drops to V2 turning off the NFET 121a and turning on the PFET 121b of the first inverter. As a result, Vout2 at output node 126 is pulled to V3, regardless of the states of CLK2 and CLK2B. In other words, Vout2 from the second stage 120 remains steady at V3.

In the third stage 130 (if applicable, e.g., in the charge pump 100.2 of FIG. 1.2), the input node 135 can be connected to receive Vout2 that is steady at V3 (as discussed above). The first capacitor 133 can be connected to receive a third clock signal (CLK3) that transitions between (i.e., oscillates between) V2 and V3. In other words, CLK3 is voltage-level shifted as compared to CLK2 but with the same amplitude. The second capacitor 134 can be connected to receive an inverted third clock signal (CLK3B), which is inverted with respect to CLK3 (i.e., when CLK3 transitions from V2 to V3, CLK3B transitions from V3 to V2, and vice versa). As a result, the voltage signal at junction 137 between the FETs of the first inverter transitions between V3 and a fourth voltage (V4) essentially four times the magnitude of V1 (e.g., +/−10%). For example, if V1=1.8V, then V4=7.2V+/−0.72V. If V1=1.5V, then V4=6.0V+/−0.60V. If V1=0.8V, then V4=3.2V+/−0.32V. Furthermore, the voltage signal at junction 138 between the FETs of the second inverter will be inverted with respect to the voltage signal at junction 137. In operation, when CLK3 switches to V2 and CLK3B switches to V3, the voltage signal at junction 137 between the FETs of the first inverter drops to V3 turning off the NFET 132a and turning on the PFET 132b of the second inverter and the voltage signal at junction 138 between the FETs of the second inverter is raised to V4 turning on the NFET 131a and turning off the PFET 131b of the first inverter. When CLK3 switches to V3 and CLK3B switches to V2, the voltage signal at junction 137 rises to V4 turning on the NFET 132a and turning off the PFET 132b of the second inverter and the voltage signal at junction 138 drops to V3 turning off the NFET 131a and turning on the PFET 131b of the first inverter. As a result, Vout3 at output node 136 is pulled to V4, regardless of the states of CLK3 and CLK3B. In other words, Vout3 from the third stage 130 remains steady at V4.

It should be understood that any additional stages would follow a similar pattern with the received clock signal-inverted clock signal pair for each downstream stage being level shifted by one VDD relative to the clock signal-inverted clock signal pair received by the previous stage.

The charge pump 100.1, 100.2 can further include an electrical load 150 electrically connected to the output node of the final stage. For example, in the charge pump 100.1 of FIG. 1.1, the electrical load 150 can be electrically connected to the output node 126 of the second stage 120 (which is the final stage). In the charge pump 100.2 of FIG. 1.2, the electrical load 150 can be electrically connected to the output node 136 of the third stage 130 (if that third stage is the final stage). In any case, the electrical load 150 could be, for example, a resistor 151 and a capacitor 152 connected in parallel between the output node of the final stage and ground. Alternatively, the electrical load 150 could be any other suitable electrical load that consumes power or energy.

By employing stage-specific clock signal-inverted clock signal pairs to control the stages of a multi-stage charge pump (where, for each downstream stage, the clock signal-inverted clock signal pair is voltage-level shifted upward by 1*V1 without changing the amplitude) instead of employing the same clock signal-inverted clock signal pairs to control all stages of a multi-stage charge pump, the disclosed embodiments eliminate that need for additional series-connected capacitors or higher voltage capacitors in the downstream stages and thereby reduce circuit complexity and chip area consumption while also improving reliability.

It should be noted that the charge pump 100.1, 100.2 can further include additional circuitry to supply such stage-specific voltage level-shifted, same amplitude, clock signal-inverted clock signal pairs to each stage 110, 120, 130 (if applicable, e.g., as in the charge pump 100.2). The additional circuitry can include a preliminary clock driver 105 and a clock generator (e.g., clock generator 180.1 including a voltage level shifter 181.1 and driving circuit 182.1 in charge pump 100.1 of FIG. 1.1 and clock generator 180.2 including a voltage level shifter 181.2 and driving circuit 182.2 in charge pump 100.2 of FIG. 1.2).

The preliminary clock driver 105 can be a logic circuit configured to receive, as inputs, an enable signal (EN) and an initial clock signal (CLK). EN and CLK can each have low and high logic levels of GND (e.g., at 0.0 volts) and V1, respectively. The preliminary clock driver 105 can further output both CLK1, which transitions between GND and V1, and CLK1B, which is inverted with respect to CLK1B. FIG. 2 is a schematic diagram illustrating one example of such a preliminary clock driver 105 that could be incorporated into the charge pump 100.1 of FIGS. 1.1 and 100.2 of FIG. 1.2. For example, the preliminary clock driver 105 can include a NAND gate 201, which is electrically connected to a positive power supply (e.g., a first voltage rail) at V1 and further electrically connected to GND. The NAND gate 201 can receive, as inputs, CLK and EN and can output an output logic value according to a conventional NAND gate truth table. That is, the output logic value of NAND gate 201 will be high (at V1) when the following conditions are met: CLK and EN are both low, CLK is low and EN is high, and CLK is high and EN is low. The output logic value of the NAND gate 201 will be low (at GND) when CLK and EN are both high. In operation, the logic output value from the NAND gate 201 can oscillate between GND and V1 (as a function of CLK and EN) effectively creating a voltage pulse. For purposes of this disclosure, a "voltage pulse" refers to an essentially rectangular direct current voltage signal that transitions between a low voltage level and a high voltage level at regular and repeated intervals such that the pulse is at the low voltage level for a first time period (t1), switches to the high voltage level and remains at the high voltage level for a second time period (t2) (which is the same as or different from t1), switches back to the low voltage level and again remains at the low voltage level for t1, and so on.

The preliminary clock driver 105 can further include a single inverter 202 (also referred to herein as an inverting buffer) electrically connected to the output of the NAND gate 201 and also a pair of series-connected inverters 203-204 (also referred to herein as series-connected inverting buffers) electrically connected to the output of the NAND gate 201. These inverters 202-204 can each be connected to the positive power supply (e.g., the first voltage rail) at V1 and to GND. In response to the output voltage pulse from the NAND gate 201, the single inverter 202 can output CLK1 (which transitions between GND and V1) and the series-connected inverters 203-204 can output CLK1B (which is inverted with respect to CLK1 so that when CLK1 transitions from GND to V1, CLK1B transitions from V1 to GND and vice versa). It should be noted that the example of the preliminary clock driver 105 described above is provided for illustration purposes and not intended to be limiting. Alternatively, any other suitable preliminary clock driver configured to generate and output CLK1 and CLK1B, as described could be employed.

The clock generator 180.1, 180.2 can include a voltage level shifter 181.1, 181.2 and a driving circuit 182.1, 182.2. The different configurations for the clock generator 180.1 and 180.2 can are due to the differences in the number of stages in the charge pump 100.1 of FIG. 1.1 as compared to the charge pump 100.2 of FIG. 1.2 and, thus, the differences in the required number of stage-specific voltage level-shifted clock signal-inverted clock signal pairs that are required for charge pump operation. For example, in the charge pump 100.1 of FIG. 1.1 with only two stages 110 and 120, the clock generator 180.1 only needs to generate CLK2 and CLK2B. In this case, the voltage level shifter 181.1 can be a single-stage voltage level shifter that receives, as input voltage pulses, CLK1 and CLK1B and that outputs multiple output voltage pulses. The multiple output voltage pulses can include, but are not limited to, an output voltage pulse (see OUT1$_i$) that transitions between V1 and V2 and an inverted output voltage pulse (see OUT1B$_i$) that is inverted with respect to OUT1i in that, when OUT1i transitions from V1 to V2, OUT1B$_i$ transitions from V2 to V1 and vice versa. In the charge pump 100.2 of FIG. 1.2 with three or more stages, the clock generator 180.2 needs to generate at least two additional clock signal-inverted clock signal pairs (i.e., CLK2-CLK2B for the second stage 120, CLK3-CLK3B for the third stage, and additional clock signal-inverted clock signal pairs for any additional stages). In this case, the voltage level shifter 181.2 can be a multi-stage voltage level shifter that receives, as input voltage pulses, CLK1 and CLK1B and that outputs multiple output voltage pulses. The multiple output voltage pulses can include: first output voltage pulses (e.g., from a first voltage level shifting stage) including, but not limited to, OUT1$_i$ and OUT1B$_i$ as described above; second output voltage pulses (e.g., from a second voltage level shifting stage) including, but not limited to, OUT2$_{i1}$ that transitions between V2 and V3 and OUT2B$_{i1}$ that is inverted with respect to OUT2$_{i1}$ in that, when OUT2$_{i1}$ transitions from V2 to V3, OUT2B$_{i1}$ transitions from V3 to V2 and vice versa; and, if necessary, additional output voltage pulses (e.g., from additional voltage level shifting stages).

In either case, the voltage level shifter 181.1, 181.2 can include a combination of both P-type transistors and N-type transistors, as discussed in greater detail below. For purposes of illustration, the P-type transistors and N-type transistors are described below and illustrated in the figures as being metal oxide semiconductor field effect transistors (MOSFETs) and, particularly, P-type field effect transistors (PFETs) and N-type field effect transistors (NFETs), respectively. A MOSFET refers to a transistor with a semiconductor channel region positioned laterally between a source region and a drain region and with a gate (e.g., including a gate dielectric-gate conductor stack) adjacent to the channel region. However, it should be understood that the figures and discussion thereof are not intended to be limiting. For example, alternatively, a similar circuit structure could be formed using bipolar junction transistors (BJTs) and, particularly, PNP BJTs and NPN BJTs.

Optionally, the transistors can all have the same maximum voltage rating and, for reduced power consumption, that maximum voltage rating can be relatively low as specified by the transistor data sheet. For example, the transistors can have a low maximum voltage rating of 3.3 volts (V) or lower. In some embodiments, the transistors can have a low maximum voltage rating of 1.8V, 1.5V or 0.8V and the first voltage (V1) can be essentially equal to that relatively low maximum voltage rating. Also, optionally, to minimize manufacturing complexity, the transistors can all be symmetric. That is, they can be designed so that the source region and the drain region are the same (e.g., same size, doping, same distance to the gate, etc.) except for minor process variations and so that the same maximum voltage rating applies to the gate-source voltage (VGS), the gate-drain voltage (VGD), and the drain-source voltage (VDS).

Figure 3:
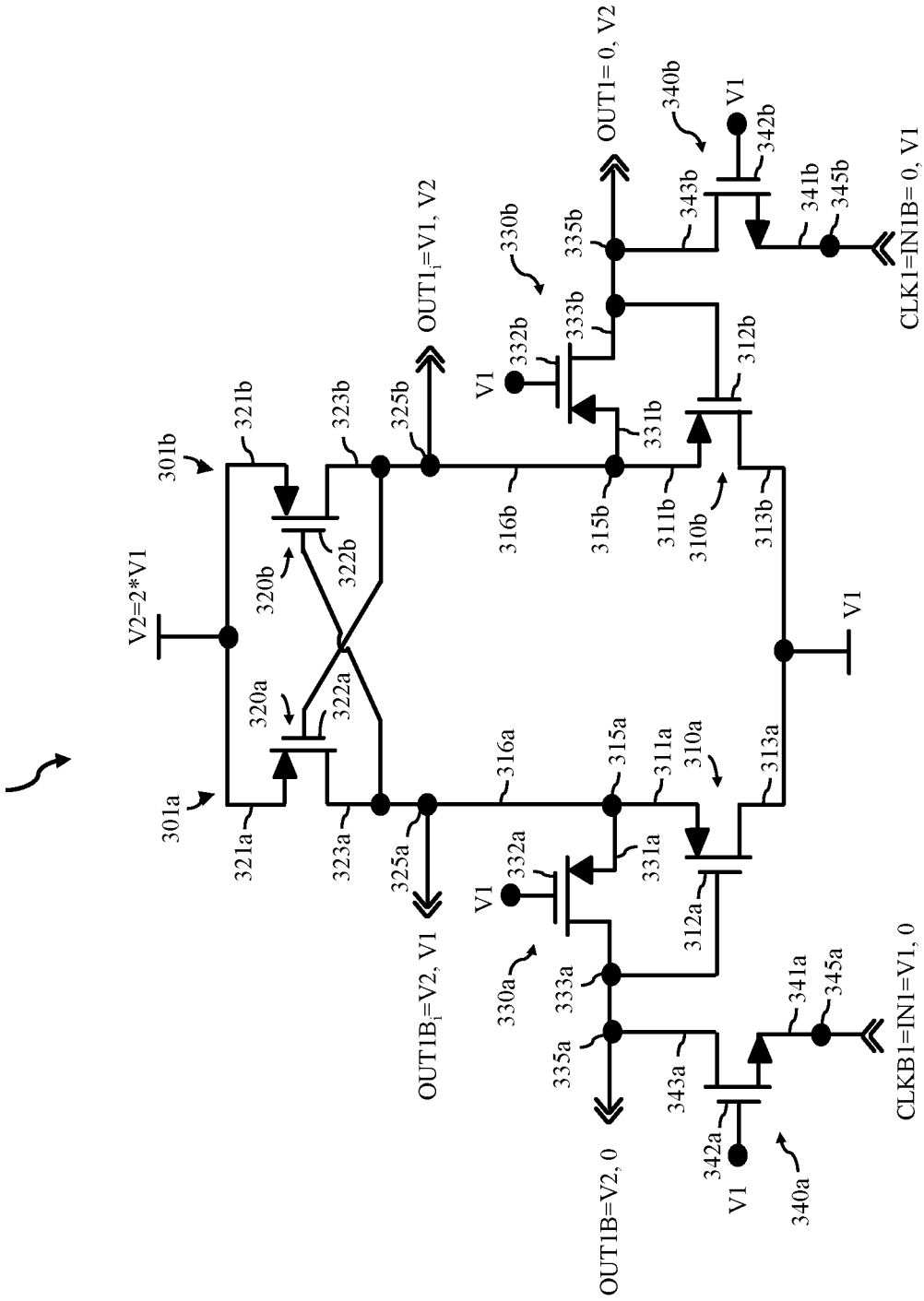
FIG. 3 is a schematic diagram illustrating an example of a stand-alone single-stage voltage level shifter that can be incorporated into the structure of FIG. 1.1 or a first voltage shifting stage that can be incorporated into the structure of FIG. 1.2.
Figure 4:
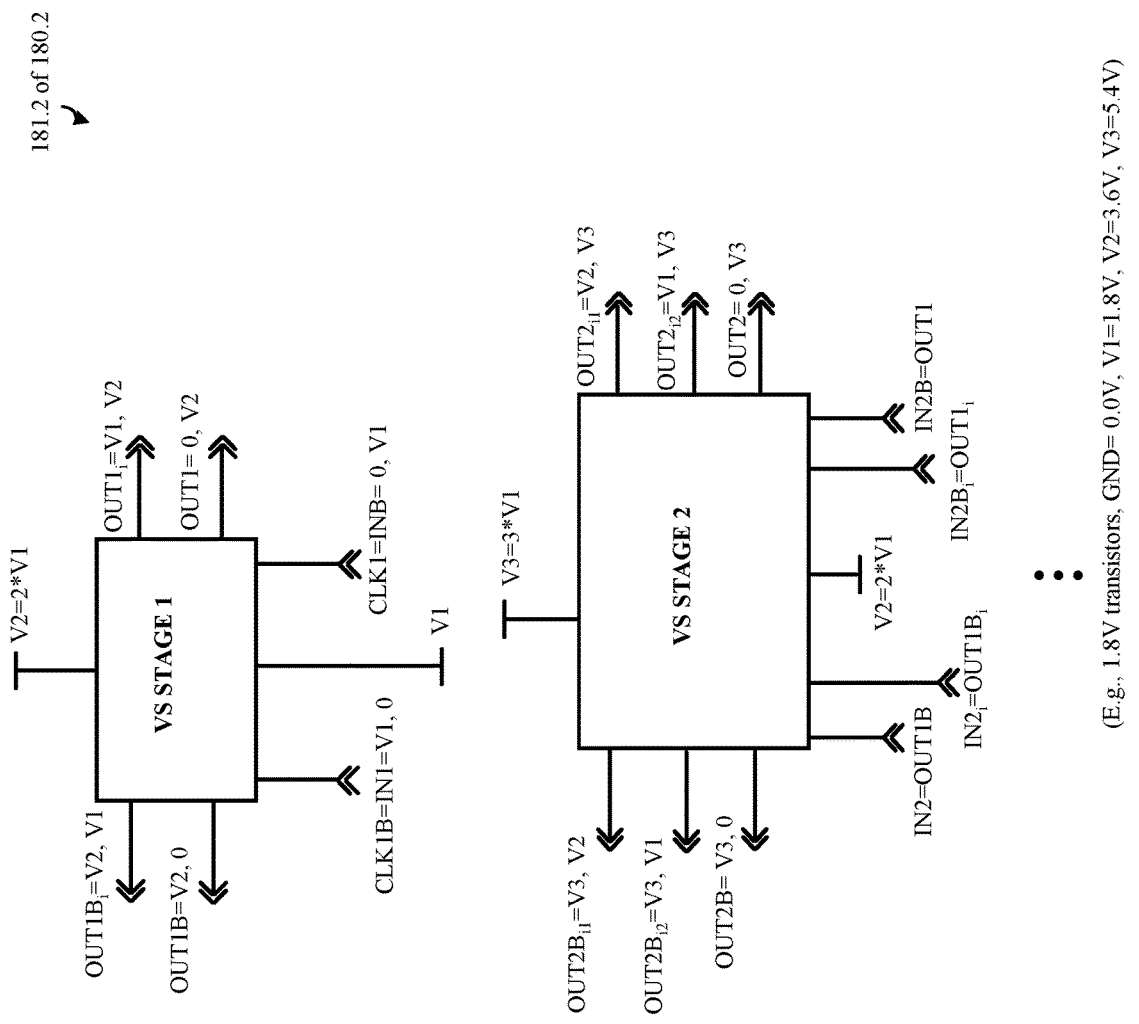
FIG. 4 is a schematic diagram illustrating a voltage level shifter that can be incorporated into the structure of FIG. 1.2.
Figure 5:
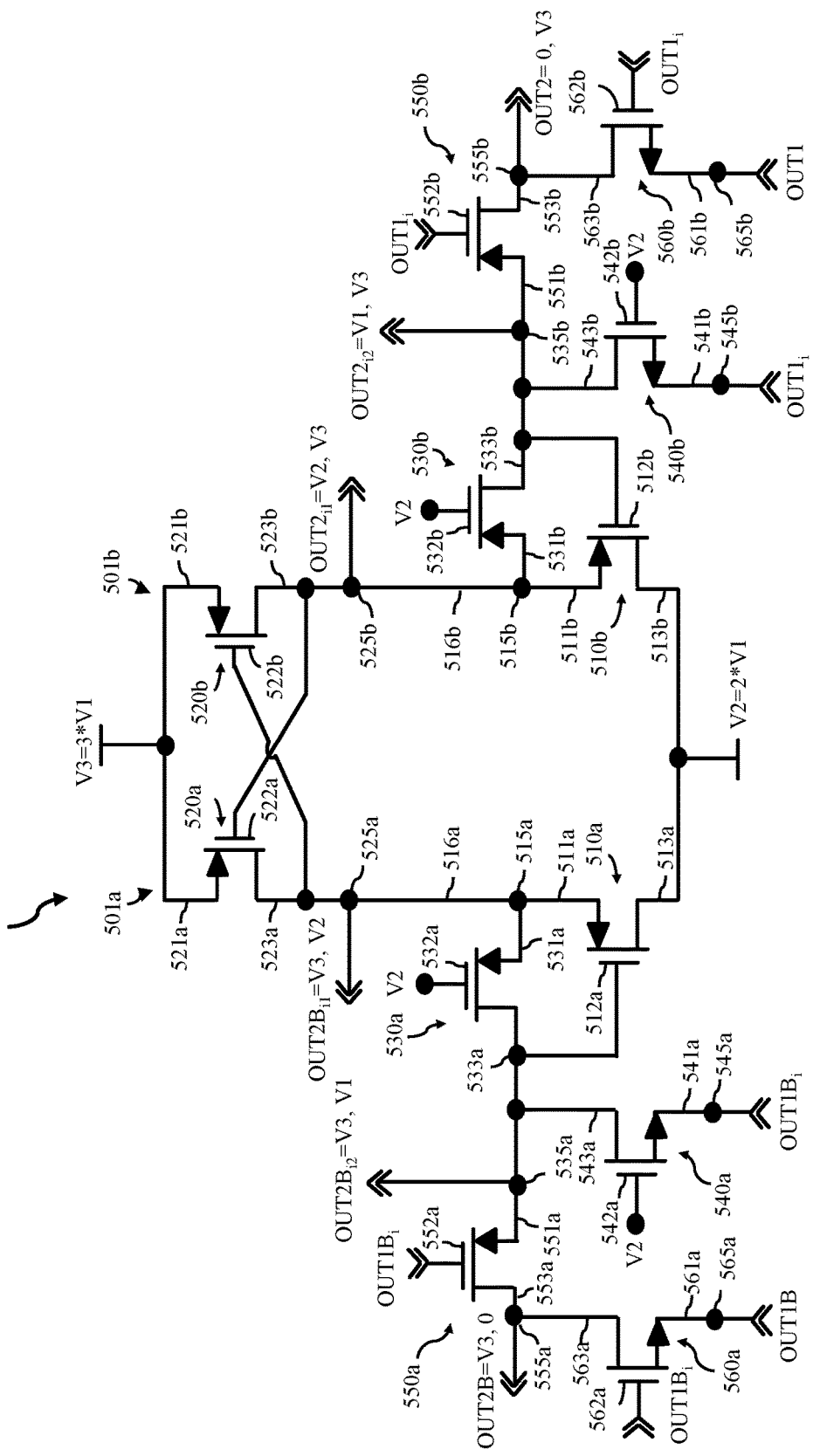
FIG. 5 is schematic diagram illustrating a second voltage shifting stage in the voltage level shifter of FIG. 4.

In some embodiments (as described below and illustrated in FIGS. 3-5) the voltage level shifter 181.1, 181.2 can specifically be configured so that, even given a low maximum voltage rating and symmetrically configured transistors, the required voltage level shifting can be achieved without violating the maximum voltage ratings so that device stress is avoided and operation within the SOA of the transistors is maintained. More specifically, FIG. 3 is a schematic diagram illustrating an example of a stand-alone single-stage voltage level shifter 181.1 in the clock generator 180.1 of the charge pump 100.1 of FIG. 1.1 or of a first voltage shifting stage (VS STAGE 1) of a multi-stage voltage level shifter 181.2 in the clock generator 180.2 of the charge pump 100.2 of FIG. 1.2. FIG. 4 is a schematic diagram illustrating, generally, an example of a voltage level shifter 181.2, which has multiple voltage shifting stages (e.g., at least a first voltage shifting stage (VS STAGE 1) and a second voltage shifting stage (VS STAGE 2)) and which can be incorporated into the clock generator 180.2 of the charge pump 100.2 of FIG. 1.2. FIG. 5 is a schematic diagram illustrating in greater detail VS STAGE 2 of FIG. 4.

Referring to FIG. 3, voltage level shifter 181.1 (or VS STAGE 1 of voltage level shifter 181.2) can be electrically connected to a first voltage rail (at V1, which, as mentioned above, can be a positive supply voltage (VDD) supplied to the charge pump and equal to a relatively low maximum voltage rating of the devices contained therein) and to a second voltage rail at V2 (which is essentially double the magnitude of V1). Voltage level shifter 181.1 (or VS STAGE 1) can further include two first input nodes 345a and 345b and four first output nodes, including two intermediate first output nodes 325a-325b and two final first output nodes 335a-335b.

The voltage level shifter 181.1 (or VS STAGE 1) can further be connected to receive two input voltage pulses (IN1 and IN1B) at the two first input nodes 345a-345b, respectively. IN1 at input node 345a can be CLK1B and IN1B at input node 345b can be CLK1. The voltage level shifter 181.1 (or VS STAGE 1) can further be configured to generate and output two intermediate first output voltage pulses (OUT1B$_i$ and OUT1$_i$) at intermediate output nodes 325a-325b, respectively, and two final first output voltage pulses (OUT1B and OUT1) at final output nodes 335a-335b, respectively. OUT1$_i$ at node 325b can transition between V1 and V2 and OUT1B$_i$ at node 325a can be inverted with respect OUT1$_i$ in that, when OUT1$_i$ transitions from V1 to V2, OUT1B$_i$ transitions from V2 to V1 and vice versa. OUT1 at node 335b can transition between GND and V2 and OUT1B at node 335a can be inverted with respect to OUT1 in that, when OUT1 transitions from GND to V2, OUT1B transitions from V2 to GND and vice versa.

As mentioned above, for purposes of this disclosure, a "voltage pulse" refers to an essentially rectangular direct current voltage signal that transitions between a low voltage level and a high voltage level at regular and repeated intervals such that the pulse is at the low voltage level for a first time period (t1), switches to the high voltage level and remains at the high voltage level for a second time period (t2) (which is the same as or different from t1), switches back to the low voltage level and again remains at the low voltage level for t1, and so on.

In order to generate the above-described first output voltage pulses, the voltage level shifter 181.1 (or VS STAGE 1) can include symmetric branches 301a-301b connected in parallel between the first voltage rail at V1 and the second voltage rail at V2. Each branch 301a, 301b can include a first PFET 310a, 310b and a second PFET 320a, 320b connected in series between first voltage rail and second voltage rail. That is, first PFET 310a, 310b can include a drain region 313a, 313b electrically connected to first voltage rail, a gate 312a, 312b, and a source region 311a, 311b. Second PFET 320a, 320b can include a drain region 323a, 323b electrically connected to source region 311a, 311b of first PFET 310a, 310b, a gate 322a, 322b, and a source region 321a, 321b electrically connected to the second voltage rail. In some embodiments, source region 311a, 311b of first PFET 310a, 310b and drain region 323a, 323b of the second PFET 320a, 320b can be a shared source/drain region. In other embodiments, source region 311a, 311b of the first PFET 310a, 310b and drain region 323a, 323b of the second PFET 320a, 320b could be discrete regions electrically connected by an interconnect.

Each branch 301a, 301b can further include an intermediate output node 325a, 325b and a third PFET 330a, 330b electrically connected to a junction 316a, 316b between first PFET 310a, 310b and second PFET 320a, 320b. Third PFET 330a, 330b can specifically include: a source region 331a, 331b, which is electrically connected to junction 316a, 316b between first PFET 310a, 310b and second PFET 320a, 320b; a drain region 333a, 333b, which is electrically connected to a final output node 335a, 335b and also to gate 312a, 312b of first PFET 310a, 310b, and a gate 332a, 332b, which is electrically connected to, e.g., the first voltage rail, so as to receive V1. Additionally, second PFET 320a of branch 301a and second PFET 320b of branch 301b can be cross coupled. That is, gate 322a of second PFET 320a in branch 301a can be electrically connected to junction 316b between first PFET 310b and second PFET 320b in branch 301b, while gate 322b of second PFET 320b in branch 301b can be electrically connected to junction 316a between first PFET 310a and second PFET 320a in branch 301a.

Finally, each branch 301a, 301b can further include an NFET 340a, 340b (also referred to herein as a pass-gate NFET). NFET 340a, 340b can include: a source region 341a, 341b, which is electrically connected to an input node 345a, 345b; a drain region 343a, 343b, which is electrically connected to final output node 335a, 335b (and thereby electrically connected to the drain region 333a, 333b of third PFET 330a, 330b as well as gate 312a, 312b of first PFET 310a, 310b).

In operation, V1 is continuously applied to gates 342a, 342b of NFETs 340a, 340b and gates 332a, 332b of third PFETs 330a, 330b. When CLK1B transitions from GND to V1 and CLK1 transitions from V1 to ground, in branch 301b, gate and source voltages of NFET 340b are at V1 and GND respectively, so the threshold voltage (VT) of NFET 340b is reached. NFET 340b turns on and pulls down the voltage on final output node 335b to ground so OUT1 is at GND. When the voltage on final output node 335b is at ground, gate voltage on first PFET 310b is at ground and the VT of first PFET 310b is reached. First PFET 310b turns on, pulling down the voltage at intermediate output node 325b to V1 so OUT1$_i$ is at V1. The gate and source voltages on third PFET 330b are both at V1, so third PFET 330b remains off. In branch 301a the gate voltage on second PFET 320a is at V1 and the source voltage is at V2, so the VT of second PFET 320a is reached. Second PFET 320a turns on, thereby pulling up the voltage on intermediate output node 325a to V2 so OUT1B$_i$ goes to V2. When intermediate output node 325a is at V2, the second PFET 320b remains off. Furthermore, the gate and source voltages on third PFET 330a are V1 and V2, respectively, so the VT of third PFET 330a is reached. Third PFET 330a turns on, pulling up the voltage on final output node 335a to V2 so OUT1B goes to V2. Third PFET 330a also pulls the gate voltage of first PFET 310a up to V2, so first PFET 310a remains off. Since the gate and source voltages of NFET 340a are both at V1, NFET 340a also remains off.

When CLK1B transitions from V1 to ground and CLK1 transitions from GND to V1, the reverse occurs. In branch 301a, gate and source voltages on NFET 340a are at V1 and ground, respectively, so the VT of NFET 340a is reached. NFET 340a turns on and pulls down the voltage on final output node 335a to GND so OUT1B is at GND. When the voltage on final output node 335a is at GND, the gate voltage on first PFET 310a is at GND and the VT of first PFET 310a is reached. First PFET 310a turns on, pulling down the voltage at intermediate output node 325a to V1 so OUT1B$_i$ is at V1. The gate and source voltages of third PFET 330a are both at V1, so third PFET 330a remains off. Additionally, in branch 301b the gate voltage on second PFET 320b is at V1 and the source voltage is at V2, so the VT of second PFET 320b is reached. Second PFET 320b turns on, thereby pulling up the voltage on intermediate output node 325b to V2 so OUT1$_i$ goes to V2. When intermediate output node 325b is at V2, second PFET 320a remains off. Furthermore, the gate and source voltages on third PFET 330b are V1 and V2, respectively, so the VT of third PFET 330b is reached. Third PFET 330b turns on, pulling up the voltage on final output node 335b to V2 so OUT1 goes to V2. Third PFET 330b also pulls up the gate voltage on first PFET 310b to V2, so first PFET 310b remains off. Since the gate and source voltages on NFET 340b are both at V1, NFET 340b also remains off.

As a result, the voltage level shifter 181.1 (or VS STAGE 1) outputs the four first output voltage pulses disclosed above include OUT1$_i$ at node 325b (which transitions between V1 and V2), OUT1B$_i$ at node 325a (which is inverted with respect to OUT1$_i$), OUT1 at node 335b (which transitions between GND and V2) and OUT1B at node 335a (which is inverted with respect to OUT1). Referring again to the charge pump 100.1 of FIG. 1.1 and the charge pump 100.2 of FIG. 1.2, the clock generator 180.1, 180.2 must generate at least CLK2 (which transitions between V1 and V2) and CLK2B (which is inverted with respect to CLK2 so that, when CLK2 transitions from V1 to V2, CLK2B transitions from V2 to V1 and vice versa). Since OUT1$_i$ similarly transitions between V1 and V2 and OUT1B$_i$ is inverted with respect to OUT1$_i$, OUT1$_i$ and OUT1B$_i$ can be processed by the driving circuit 182.1, 182.2, as discussed in greater detail below, in the clock generator 180.1, 180.2 to generate CLK2 and CLK2B.

As mentioned above, FIG. 4 is a schematic diagram illustrating, generally, an example of a voltage level shifter 181.2, which has multiple voltage shifting stages and which can be incorporated into the clock generator 180.2 of the charge pump 100.2 of FIG. 1.2. The voltage shifting stages can at least include VS STAGE 1, as described in detail above and illustrated in FIG. 2, and VS STAGE 2, as described in greater detail below and illustrated in FIG. 5.

More specifically, referring to FIG. 4, the voltage level shifter 181.2 can be a multi-stage voltage level shifter including at least VS STAGE 1 (see the discussion of FIG. 3 above) and VS STAGE 2. VS STAGE 2 can be connected to the second voltage rail at V2 and to a third voltage rail at V3. Referring to FIG. 5, VS STAGE 2 can be configured to receive the four first output voltage pulses (i.e., OUT1$_i$, OUT1B$_i$, OUT1, and OUT1B) from VS STAGE1, as inputs, and two generate and output six second output voltage pulses. The configuration of VS STAGE 2 can be similar to that of VS STAGE 1 but with a total of twelve transistors instead of ten, as discussed below. Specifically, VS STAGE 2 can include symmetric branches 501a-501b. Each branch 501a, 501b can include a first PFET 510a, 510b and a second PFET 520a, 520b connected in series between the second voltage rail at V2 and the third voltage rail at V3. That is, first PFET 510a, 510b can include a drain region 513a, 513b electrically connected to second voltage rail, a gate 512a, 512b, and a source region 511a, 511b. Second PFET 520a, 520b can include a drain region 523a, 523b electrically connected to source region 511a, 511b of first PFET 510a, 510b, a gate 522a, 522b, and a source region 521a, 521b electrically connected to the third voltage rail.

Each branch 501a, 501b can further include an intermediate output node 525a, 525b and a third PFET 530a, 530b electrically connected to a junction 516a, 516b between first PFET 510a, 510b and second PFET 520a, 520b. Third PFET 530a, 530b can specifically include: a source region 531a, 531b, which is electrically connected to junction 516a, 516b between first PFET 510a, 510b and second PFET 520a, 520b; a drain region 533a, 533b, which is electrically connected to another intermediate output node 535a, 535b and also to gate 512a, 512b of first PFET 510a, 510b, and a gate 532a, 532b, which is electrically connected to, e.g., the second voltage rail so as to receive V2.

Each branch 501a, 501b can further include a first NFET 540a, 540b (also referred to herein as a first pass-gate NFET). First NFET 540a, 540b can include: a source region 541a, 541b, which is electrically connected to an intermediate input node 545a, 545b; a drain region 543a, 543b, which is electrically connected to the intermediate output node 535a, 535b (and thereby electrically connected to the drain region 533a, 533b of third PFET 530a, 530b as well as gate 512a, 512b of first PFET 510a, 510b), and a gate 542a, 542b, which is electrically connected, e.g., to the second voltage rail to receive V2. The intermediate input node 545a can be connected to receive, as an input, OUT1B$_i$ from the VS STAGE 1 and intermediate input node 545b can be connected to receive, as an input, OUT1$_i$ from the VS STAGE 1. As discussed above, OUT1$_i$ transitions between V1 and V2 and OUT1B$_i$ is inverted with respect to OUT1$_i$.

Each branch 501a, 501b can further include a final output node 555a, 555b and a fourth PFET 550a, 550b electrically connected in series between third PFET 530a, 530b and the final output node 555a, 555b. Fourth PFET 550a, 550b can specifically include: a source region 551a, 551b, which is electrically connected to the intermediate output node 535a, 535b; a drain region 553a, 553b, which is electrically connected to the final output node 555a, 555b, and a gate 552a, 552b. Gate 552a of fourth PFET 550a in branch 501a can specifically be connected to the intermediate input node 545a to receive, as an input, OUT1B$_i$ from VS STAGE 1, whereas gate 552b of fourth PFET 550b in branch 501b can specifically be connected to the intermediate input node 545b to receive, as an input, OUT1$_i$ from VS STAGE 1. As discussed above, OUT1$_i$ transitions between V1 and V2 and OUT1B$_i$ is inverted with respect to OUT1$_i$.

Each branch 501a, 501b can further include a second NFET 560a, 560b (also referred to herein as a second pass-gate NFET). Second NFET 560a, 560b can include: a source region 561a, 561b, which is electrically connected to input node 565a, 565b; a drain region 563a, 563b, which is electrically connected to the final output node 555a, 555b (and thereby electrically connected to the drain region 553a, 553b of fourth PFET 550a, 550b); and a gate 562a, 562b. Gate 562a of second NFET 560a can specifically be connected to receive OUT1B$_i$ from the intermediate input node 545a and gate 562b of second NFET 560b can specifically be connected to receive OUT1$_i$ from intermediate input node 545b. Furthermore, the input node 565a can be connected to receive, as an input, OUT1B from VS STAGE 1 and input node 565b can be connected to receive, as an input, OUT1 from VS STAGE 1. As discussed above, OUT1 transitions between ground and V2 and OUT1B is inverted with respect to OUT1.

The second PFET 520a of branch 501a and second PFET 520b of branch 501b can be cross coupled. That is, gate 522a of second PFET 520a in branch 501a can be electrically connected to junction 516b between first PFET 510b and second PFET 520b in branch 501b, while gate 522b of second PFET 520b in branch 501b can be electrically connected to junction 516a between first PFET 510a and second PFET 520a in branch 501a.

Figure 6A:
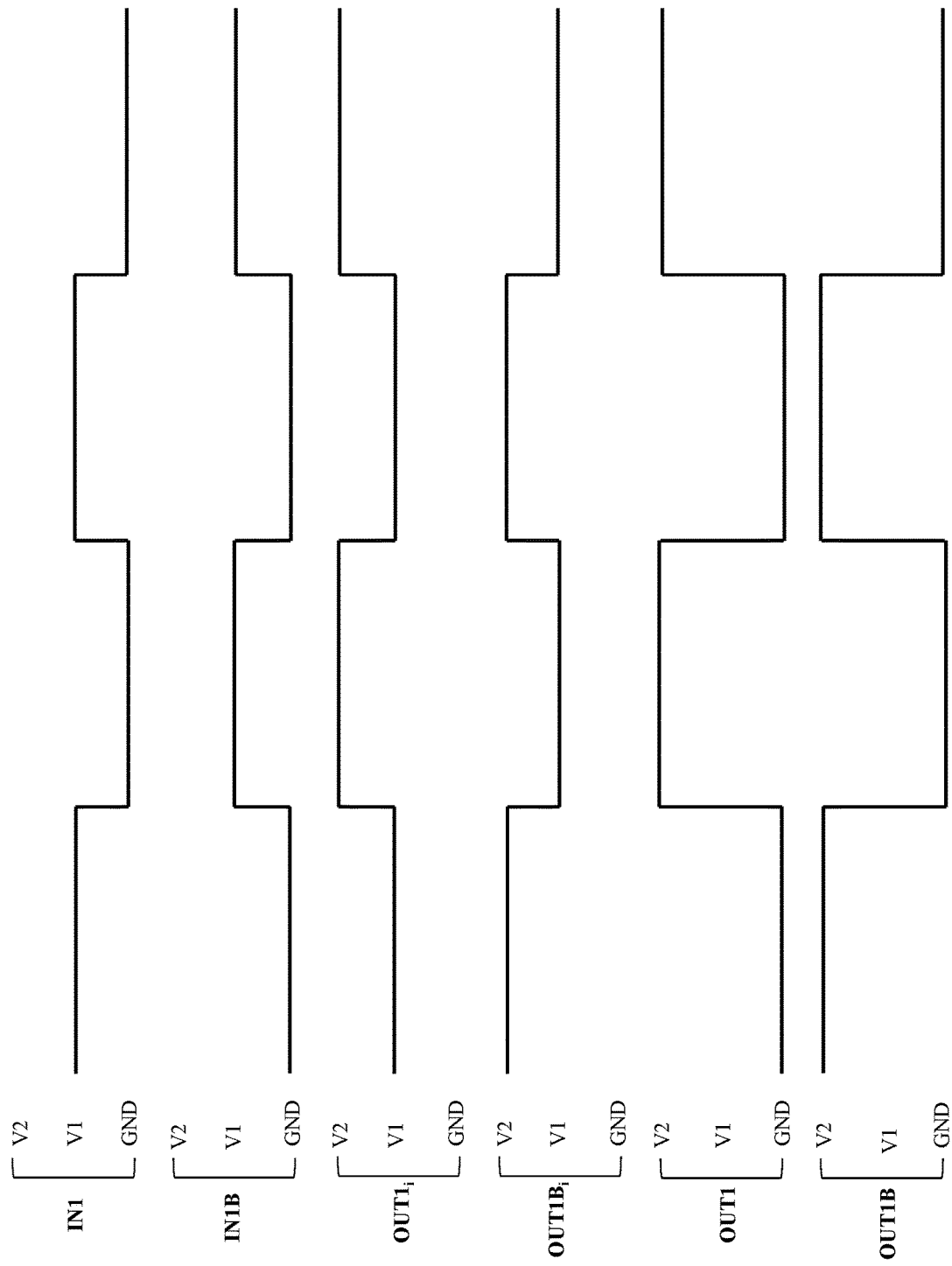
FIG. 6A shows an example of a timing diagram illustrating input and output voltage pulses associated with a single-stage voltage level shifter or a first voltage shifting stage of a multi-stage voltage level shifter.

FIG. 6A shows an example of a timing diagram illustrating the input voltage pulses received by voltage level shifter 181.1 (or by VS STAGE 1 in the voltage level shifter 181.2) and the resulting first output voltage pulses (i.e., OUT1$_i$, OUT1B$_i$, OUT1, and OUT1B) that are further received as input voltage pulses by VS STAGE 2.

Figure 6B:
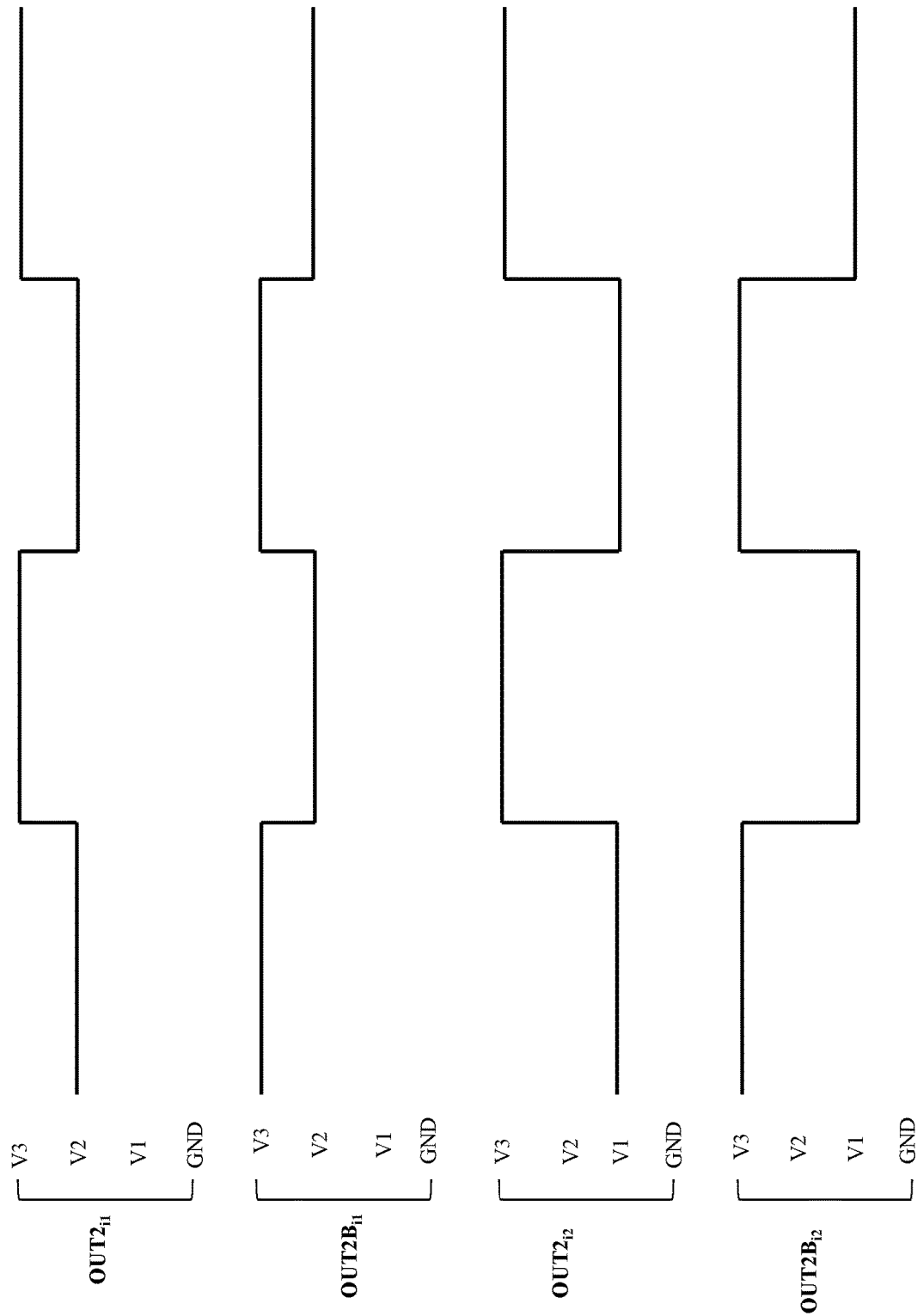
FIGS. 6B-6C show an example of a timing diagram illustrating second output voltage pulses from a second voltage shifting stage of a multi-stage voltage level shifter.
Figure 6C:
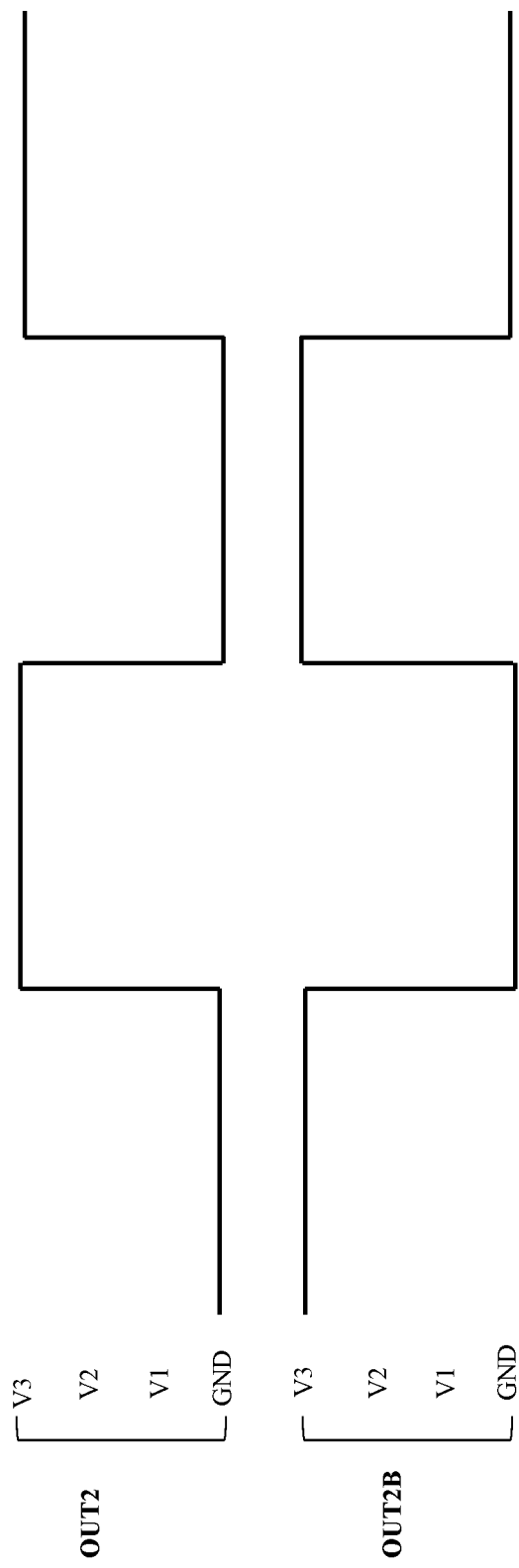

FIGS. 6B-6C show an example of a timing diagram illustrating the six second output voltage pulses from VS STAGE 2. FIG. 6B specifically shows four intermediate second output voltage pulses (i.e., OUT2$_{i1}$, OUT2B$_{i1}$, OUT2$_{i2}$, OUT2B$_{i2}$, OUT2, and OUT2B) generated and output by VS STAGE 2 in response to the voltage pulses received from VS STAGE 1. Specifically, the six second output voltage pulses can include four intermediate second output voltage pulses (as shown in FIG. 6B) include: intermediate second output voltage pulse (OUT2$_{i1}$) generated and output at node 525b in branch 501b, inverted intermediate second output voltage pulse (OUT2B$_{i1}$) generated and output at node 525a in branch 501a, additional intermediate second output voltage pulse (OUT2$_{i2}$) generated and output at node 535b in branch 501b, inverted additional intermediate second output voltage pulse (OUT2B$_{i2}$) generated and output at node 535a in branch 501a. As indicated, OUT2$_{i1}$ transitions between V2 and V3, OUT2B$_{i1}$ is inverted with respect to OUT2$_{i1}$ (i.e., transitions from V3 to V2 when OUT2$_{i1}$ transitions from V3 to V2 and vice versa), OUT2$_{i2}$ transitions between V1 and V3, and OUT2B$_{i2}$ is inverted with respect to OUT2$_{i2}$ (i.e., transitions from V3 to V1 when OUT2$_{i2}$ transitions from V1 to V3 and vice versa). The six second output voltage pulses can further include two final second output voltage pulses (as shown in FIG. 6C) including: final second output voltage pulse (OUT2) generated and output at node 555b in branch 501b and an inverted final second output voltage pulse (OUT2B) generated and output at node 555a in branch 501a. As indicated, OUT2 transitions between GND and V3, and OUT2B is inverted with respect to OUT2 (i.e., transitions from V3 to GND when OUT2 transitions from ground to V3 and vice versa).

Although not shown, it should be understood that the voltage level shifter 181.2 could further include additional voltage shifting stages, depending upon the number of stages in the charge pump 100.2. For example, if the charge pump 100.2 included a fourth stage, the voltage level shifter 181.2 could further include a third voltage shifting stage (VS STAGE 3, not shown) connected to the third voltage rail at V3 and to a fourth voltage rail at V4. VS STAGE 3 could further be configured to receive, as inputs, the six second output voltage pulses from VS STAGE 2 and to generate and output eight third output voltage pulses. Optionally, the voltage level shifter 181.2 could further include one or more additional voltage shifting stages up to an nth stage. Specifically, if the charge pump 100.2 includes some number n of stages, the voltage level shifter 181.2 can include n−1 voltage level shifting stages. Each additional voltage shifting stage will have a similar structure to the previous voltage shifting stage but will include four additional transistors (one PFET and one NFET in each of the two branches therein), two additional inputs, and two additional outputs.

As mentioned above, the clock generator 180.1, 180.2 of the charge pump 100.1, 100.2 can include both a voltage level shifter 181.1, 181.2, as described above, and a driving circuit 182.1, 182.2, which is configured to receive and process specific ones of the multiple output voltage pulses from the voltage level shifter 182.1, 182.2 in order to generate and output the voltage level-shifted clock signal-inverted clock signal pairs (e.g., CLK2-CLK2B and, if applicable, CLK3-CLK3B, etc.) required for charge pump 100.1, 100.2 operation.

As mentioned above, in the charge pump 100.1 of FIG. 1.1 and the charge pump 100.2 of FIG. 1.2, the clock generator 180.1, 180.2 must generate and output at least CLK2 (which transitions between V1 and V2) and CLK2B (which is inverted with respect to CLK2 so that, when CLK2 transitions from V1 to V2, CLK2B transitions from V2 to V1 and vice versa). Since OUT1$_i$ similarly transitions between V1 and V2 and OUT1B$_i$ is inverted with respect to OUT1$_i$, OUT1$_i$ and OUT1B$_i$ can be processed by the driving circuit 182.1, 182.2 in the clock generator 180.1, 180.2 to generate CLK2 and CLK2B. For example, FIG. 7 is a schematic diagram illustrating a driving circuit 182.1, which can be incorporated into the clock generator 180.1, and FIG. 8 is a schematic diagram illustrating a driving circuit 182.2, which can be incorporated into to the clock generator 180.2. The driving circuits 182.1 and 182.2 of FIGS. 7 and 8, respectively, can each include a pair of inverters 796-797, 896-897, which are connected to the first voltage rail at V1 and the second voltage rail at V2, which receive OUT1B$_i$ and OUT1$_i$ as inputs, and which output CLK2 and CLK2B, respectively. Additionally, in the charge pump 100.2 of FIG. 1.2, the clock generator 180.2 must also generate and output at least one additional voltage level-shifted clock signal-inverted clock signal pair including: CLK3 (which transitions between V2 and V3) and CLK3B (which is inverted with respect to CLK3 so that, when CLK3 transitions from V2 to V3, CLK3B transitions from V3 to V2 and vice versa). Since $OUT2_{i1}$ similarly transitions between V2 and V3 and $OUT2B_{i1}$ is inverted with respect to $OUT2_{i1}$, $OUT2_{i1}$ and $OUT2B_{i1}$ can be processed by the driving circuit 182.2 in the clock generator 180.2 to generate CLK3 and CLK3B. Thus, the driving circuit 182.2 of FIG. 8 can include an additional pair of inverters 898-899, which are connected to the second voltage rail at V2 and the third voltage rail at V3, which receive $OUT1B_i$ and $OUT1_i$ as inputs, and which output CLK3 and CLK3B, respectively.

It should be noted that the clock generator 180.1, 180.2 examples (including a voltage level shifter 181.1, 181.2 and a clock generator 182.1, 182.2), as discussed above and illustrated in the figures, have been provided for illustration purposes and are not intended to be limiting. Alternatively, any other clock generator 180.1, 180.2 configuration could be employed, where a voltage level shifter 180.1, 180.2 receives CLK1 and CLK1B, as inputs, and, in response, outputs multiple output voltage pulses and where a driving circuit 182.1, 182.2 receives specific ones of those output voltage pulses and processes them to generate the required voltage level-shifted clock signal-inverted clock signal pairs required for charge pump 100.1, 100.2 operation.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    multiple charge pump stages including: a first stage receiving a voltage input at a first voltage, a first clock signal, and an inverted first clock and outputting a first stage voltage output at a second voltage higher than the first voltage; and a second stage; and
    a clock generator receiving the first clock signal and the inverted first clock signal and outputting a second clock signal and an inverted second clock signal that are voltage level-shifted relative to the first clock signal and the inverted first clock signal,
    wherein the first clock signal and the second clock signal have a same amplitude,
    wherein the second stage receives the first stage voltage output, the second clock signal, and the inverted second clock signal and outputs a second stage voltage output at a third voltage that is higher than the second voltage,
    wherein the first clock signal transitions between ground and the first voltage, and
    wherein the clock generator includes:
        a voltage level shifter receiving the first clock signal and the inverted first clock signal and outputting multiple output voltage pulses including: a first output voltage pulse transitioning between the first voltage and the second voltage; and an inverted first output voltage pulse; and
        a driving circuit receiving the inverted first output voltage pulse and the first output voltage pulse and outputting the second clock signal and the inverted second clock signal, wherein the second clock signal transitions between the first voltage and the second voltage.

2. The structure of claim 1, wherein the second voltage is essentially double the first voltage and wherein the third voltage is essentially triple the first voltage.

3. The structure of claim 1, further comprising a preliminary clock driver receiving an initial clock signal and outputting the first clock signal and the inverted first clock signal.

4. The structure of claim 1,
wherein the driving circuit includes multiple inverting buffers including two first inverting buffers that receive the inverted first output voltage pulse and the first output voltage pulse and that output the second clock signal and the inverted second clock signal, respectively, and
wherein power supplies for the first inverting buffers are at the first voltage and the second voltage.

5. The structure of claim 1, wherein the multiple charge pump stages only include the first stage and the second stage and wherein the voltage level shifter is a single-stage voltage level shifter.

6. The structure of claim 1, wherein the multiple charge pump stages include the first stage, the second stage, and at least one additional stage and wherein the voltage level shifter is a multi-stage voltage level shifter.

7. The structure of claim 1, wherein the voltage level shifter further includes multiple transistors, wherein the multiple transistors are all symmetric and have the same voltage rating equal to the first voltage, and wherein the first voltage is a positive voltage of 3.3 volts or less.

8. The structure of claim 1, wherein the first voltage is any of 1.8 volts, 1.5 volts, and 0.8 volts.

9. The structure of claim 1,
wherein each stage of the multiple charge pump stages includes: an input node; an output node; a pair of cross coupled inverters connected between the input node and the output node; and a pair of capacitors, and
wherein each capacitor of the pair of capacitors has one capacitor plate connected to a junction between a P-type transistor and an N-type transistor of a corresponding one of the cross coupled inverters and another capacitor plate connected to receive a corresponding one of a stage-specific clock signal and an inverted stage-specific clock signal.

10. The structure of claim 9, wherein the capacitors in all pairs for all stages have equal capacitances.

11. A structure comprising:
multiple charge pump stages including: a first stage receiving a voltage input at a first voltage, a first clock signal, and an inverted first clock and outputting a first stage voltage output at a second voltage essentially double the first voltage; and a second stage; and
a clock generator receiving the first clock signal and the inverted first clock signal and outputting a second clock signal and an inverted second clock signal that are voltage level-shifted relative to the first clock signal and the inverted first clock signal,
wherein the first clock signal and the second clock signal have a same amplitude,
wherein the second stage receives the first stage voltage output, the second clock signal, and the inverted second clock signal and outputs a second stage voltage output at a third voltage essentially triple the first voltage,
wherein the first clock signal transitions between ground and the first voltage, and
wherein the clock generator includes:
a voltage level shifter receiving the first clock signal and the inverted first clock signal and outputting multiple output voltage pulses including: a first output voltage pulse transitioning between the first voltage and the second voltage; and an inverted first output voltage pulse; and
a driving circuit receiving the inverted first output voltage pulse and the first output voltage pulse and outputting the second clock signal and the inverted second clock signal, wherein the second clock signal transitions between the first voltage and the second voltage.

12. The structure of claim 11, further comprising a preliminary clock driver receiving an initial clock signal and outputting the first clock signal and the inverted first clock signal.

13. The structure of claim 11,
wherein the driving circuit includes multiple inverting buffers including two first inverting buffers that receive the inverted first output voltage pulse and the first output voltage pulse and that output the second clock signal and the inverted second clock signal, respectively, and
wherein power supplies for the first inverting buffers are at the first voltage and the second voltage.

14. The structure of claim 11, wherein the multiple charge pump stages and the voltage level shifter include one of the following:
two charge pump stages and a single-stage voltage level shifter; and
more than two charge pump stages and a multi-stage voltage level shifter.

15. The structure of claim 11, wherein the voltage level shifter further includes multiple transistors, wherein the multiple transistors are all symmetric and have the same voltage rating equal to the first voltage, and wherein the first voltage is a positive voltage of 3.3 volts or less.

16. The structure of claim 11,
wherein each stage of the multiple charge pump stages includes: an input node; an output node; a pair of cross coupled inverters connected between the input node and the output node; and a pair of capacitors,
wherein each capacitor of the pair of capacitors has one capacitor plate connected to a junction between a P-type transistor and an N-type transistor of a corresponding one of the cross coupled inverters and another capacitor plate connected to receive a corresponding one of a stage-specific clock signal and an inverted stage-specific clock signal, and
wherein the capacitors in all pairs for all stages have equal capacitances.

17. The structure of claim 11, wherein the first voltage is any of 1.8 volts, 1.5 volts, and 0.8 volts.

18. A structure comprising:
multiple charge pump stages including: a first stage receiving a voltage input at a first voltage, a first clock signal, and an inverted first clock and outputting a first stage voltage output at a second voltage essentially double the first voltage; a second stage; and a third stage; and
a clock generator receiving the first clock signal and the inverted first clock signal and outputting a second clock signal and an inverted second clock signal that are voltage level-shifted relative to the first clock signal and the inverted first clock signal and further outputting a third clock signal and an inverted third clock signal that are voltage level-shifted relative to the second clock signal and the inverted second clock signal,
wherein the second stage receives the first stage voltage output, the second clock signal, and the inverted second clock signal and outputs a second stage voltage output at a third voltage essentially triple the first voltage,
wherein the third stage receives the second stage voltage output, the third clock signal, and the inverted third clock signal and outputs a third stage voltage output at a fourth voltage essentially four times the first voltage, wherein the first clock signal transitions between ground and the first voltage, and wherein the clock generator includes:
- a voltage level shifter receiving the first clock signal and the inverted first clock signal and outputting multiple output voltage pulses including: a first output voltage pulse transitioning between the first voltage and the second voltage; and an inverted first output voltage pulse; and
- a driving circuit receiving the inverted first output voltage pulse and the first output voltage pulse and outputting the second clock signal and the inverted second clock signal, wherein the second clock signal transitions between the first voltage and the second voltage.

* * * * *